United States Patent
Hsu et al.

(10) Patent No.: US 8,421,141 B2
(45) Date of Patent: Apr. 16, 2013

(54) NON-VOLATILE MEMORY DEVICE AND METHOD OF FABRICATING THE SAME

(75) Inventors: Cheng-Yuan Hsu, Hsinchu (TW); Chun-Hsiao Li, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 13/175,896

(22) Filed: Jul. 4, 2011

(65) Prior Publication Data

US 2012/0261736 A1    Oct. 18, 2012

(30) Foreign Application Priority Data

Apr. 18, 2011   (TW) ............................. 100113397 A

(51) Int. Cl.
*H01L 29/788*    (2006.01)

(52) U.S. Cl.
USPC .......................................... 257/315; 438/257

(58) Field of Classification Search .......... 257/314–317; 438/229, 239, 257, 201, 211, 128
See application file for complete search history.

(56) References Cited

U.S. PATENT DOCUMENTS

| | | | |
|---|---|---|---|
| 5,242,848 A | 9/1993 | Yeh | |
| 5,679,970 A * | 10/1997 | Hartmann | 257/320 |
| 6,362,048 B1 * | 3/2002 | Huang | 438/257 |
| 7,447,073 B2 | 11/2008 | Tran et al. | |
| 2003/0227047 A1 * | 12/2003 | Hsu et al. | 257/314 |
| 2008/0099789 A1 * | 5/2008 | Kotov et al. | 257/202 |
| 2010/0127308 A1 | 5/2010 | Do et al. | |

OTHER PUBLICATIONS

Kwang Soo Seol; Heesoo Kang; Jaeduk Lee; Hyunsuk Kim; Byungkyu Cho; Dohyun Lee; Yong-Lack Choi; Nok-Hyun Ju; Changmin Choi; SungHoi Hur; Jungdal Choi; Chilhee Chung; , "A new floating gate cell structure with a silicon-nitride cap layer for sub-20 nm NAND flash memory," 2010 Symposium on VLSI Technology (VLSIT), pp. 127-128, Jun. 15-17, 2010.*

* cited by examiner

*Primary Examiner* — N Drew Richards
*Assistant Examiner* — Christina Sylvia
(74) *Attorney, Agent, or Firm* — Jianq Chyun IP Office

(57) ABSTRACT

A non-volatile memory device includes a substrate, a gate stack, a selecting gate, an erasing gate, a source region, and a drain region. The gate stack on the substrate includes from bottom to top a tunneling dielectric layer, a floating gate, an inter-gate dielectric layer, a control gate, and a spacer that is located between sidewalls of the control gate and the inter-gate dielectric layer. A side of the floating gate adjacent to the erasing gate has a warp-around profile and a sharp corner protruding from a vertical surface of the spacer. The selecting and erasing gates are respectively located at first and second sides of the substrate of the gate stack. The source region is located in the substrate under the erasing gate. The drain region is located in the substrate at a side of the selecting gate.

6 Claims, 7 Drawing Sheets

NON-VOLATILE MEMORY DEVICE AND METHOD OF FABRICATING THE SAME

CROSS-REFERENCE TO RELATED APPLICATION

This application claims the priority benefit of Taiwan application serial no. 100113397, filed on Apr. 18, 2011. The entirety of the above-mentioned patent application is hereby incorporated by reference herein and made a part of this specification.

BACKGROUND OF THE INVENTION

1. Field of the Invention

The invention relates to a memory device and a method of fabricating the same. More particularly, the invention relates to a non-volatile memory device and a method of fabricating the same.

2. Description of Related Art

Non-volatile memory devices are capable of storing, reading, and erasing data repeatedly and have the advantage of retaining the stored data even after the system is powered off. Therefore, the non-volatile memory devices have been extensively applied to personal computers and electronic equipment.

A typical non-volatile memory device includes a floating gate and a control gate. The control gate is formed directly on the floating gate and is separated from the floating gate by a dielectric layer. Besides, the floating gate is separated from a substrate by a tunneling oxide layer. This device is commonly known as a stacked gate flash memory device.

When data are erased from the non-volatile memory, it is difficult to control the quantity of electrons ejected from the floating gate, and thus excessive electrons may be ejected from the floating gate. Thereby, the floating gate may have a net positive charge, which refers to as the "over-erasing" phenomenon. When the over-erasing phenomenon is severe, the channel underneath the floating gate may be turned on before an operating voltage is applied to the control gate. As a result, reading errors may occur. In order to solve the over-erasing issue, split gate non-volatile memories have been introduced. The split gate non-volatile memory includes the control gate, the floating gate, and a selecting gate (i.e., an erasing gate) that is located on a sidewall of the control gate, on a sidewall of the floating gate, and above the substrate. The selecting gate (i.e., the erasing gate) is separated from the control gate, the floating gate, and the substrate by a gate dielectric layer. With this configuration, even when the over-erasing problem is so severe that the channel underneath the floating gate keeps open in the absence of an operating voltage applied to the control gate, the channel underneath the selecting gate is still closed. Thus, the drain/source region 114 cannot be turned on, and the data read-out errors can be prevented.

Based on Flower-Nordheim (FN) tunneling, which is a common way to erase data, carriers can flow between the floating gate and the erasing gate. However, the strength of electric field between the floating gate and the erasing gate is relevant to the side profile of the floating gate. Since it is difficult to control the fabrication of the side profile of the floating gate, the erasing efficiency cannot consistently remain high.

SUMMARY OF THE INVENTION

The invention is directed to a non-volatile memory device in which a floating gate has a warp-around profile and a sharp corner, so as to increase the strength of electric field, optimize the erasing efficiency and reliability, and improve the erasing performance.

The invention is further directed to a method of fabricating a non-volatile memory device. By applying a simple and controllable process, a floating gate having a warp-around profile and a sharp corner can be formed, and the profiles of the floating gates can remain consistent.

In an embodiment of the invention, a non-volatile memory that includes a substrate, a first gate stack, a selecting gate, an erasing gate, a source region, a drain region, a first dielectric layer, and a second dielectric layer is provided. The first gate stack is located on the substrate and includes a tunneling dielectric layer, a floating gate, an inter-gate dielectric layer, a control gate, and a spacer. The tunneling dielectric layer, the floating gate, the inter-gate dielectric layer, and the control gate are sequentially stacked from bottom to top. The spacer is located on a sidewall of the control gate and a sidewall of the inter-gate dielectric layer. A side of the floating gate adjacent to the erasing gate has a warp-around profile and has a sharp corner that protrudes from a vertical surface of the spacer. The selecting gate is located on the substrate at a first side of the first gate stack. The erasing gate is located on the substrate at a second side of the first gate stack. The source region is located in the substrate under the erasing gate. The drain region is located in the substrate at a side of the selecting gate. The first dielectric layer is located between the first gate stack and the erasing gate and between the first gate stack and the source region. The second dielectric layer is located between the selecting gate and the substrate.

According to an embodiment of the invention, the erasing gate has a recess profile corresponding to the sharp corner of the floating gate.

According to an embodiment of the invention, the first dielectric layer conformally covers a surface of the first gate stack and a surface of the source region.

According to an embodiment of the invention, the non-volatile memory further includes a buffer layer that is located between the spacer and the floating gate.

According to an embodiment of the invention, the first gate stack further includes a cap layer that is located on the control gate.

According to an embodiment of the invention, the non-volatile memory further includes a second gate stack and another drain region. A structure of the second gate stack and a structure of the first gate stack are the same, and the first and second gate stacks together constitute a gate stack set. Another drain region is located in the substrate at a side of the second gate stack.

In an embodiment of the invention, a method of fabricating a non-volatile memory is provided. In the method, a tunneling dielectric layer and a first patterned conductive layer are sequentially formed on a substrate. A patterned inter-gate dielectric layer and a second patterned conductive layer are stacked on a first surface of the first patterned conductive layer, and a second surface of the first patterned conductive layer is exposed. The second surface is adjacent to the first surface. The substrate is covered by a passivation layer, and a first sidewall of the first patterned conductive layer is exposed. A recess is formed on the first sidewall of the first patterned conductive layer, such that the first sidewall has a sharp corner. A source region is formed in the substrate adjacent to the first sidewall of the first patterned conductive layer. A portion of the passivation layer on the second surface is removed, such that the sharp corner of the first patterned conductive layer is exposed. A drain region is formed in the substrate outside a second sidewall of the first patterned conductive layer.

According to an embodiment of the invention, the step of forming the passivation layer includes forming a buffer layer on the second surface of the first patterned conductive layer and forming a spacer and a shielding layer on the buffer layer and the substrate at a first side of the second patterned conductive layer. The spacer is located between the second patterned conductive layer and the shielding layer.

According to an embodiment of the invention, the step of removing the portion of the passivation layer on the second surface includes removing the shielding layer and the underlying buffer layer to expose the sharp corner of the first patterned conductive layer.

According to an embodiment of the invention, the step of forming the first patterned conductive layer, the patterned inter-gate dielectric layer, the second patterned conductive layer, the buffer layer, the spacer, and the shielding layer includes forming a first conductive layer on the tunneling dielectric layer and exposing a portion of the tunneling dielectric layer. The patterned inter-gate dielectric layer and the second patterned conductive layer are formed on the first conductive layer. A portion of the first conductive layer at the first side of the second patterned conductive layer is removed. A buffer material layer is formed on the first conductive layer at a second side of the second patterned conductive layer. The spacer and the shielding layer are formed on a sidewall of the second patterned conductive layer, a sidewall of the patterned inter-gate dielectric layer, and the second sidewall of the first patterned conductive layer, and the buffer material layer at the second side of the second patterned conductive layer is exposed. The buffer material layer exposed by the shielding layer at the second side of the second patterned conductive layer is removed, and the first conductive layer located under the buffer material layer is removed. The remaining first conductive layer is the first patterned conductive layer, and the remaining buffer material layer is the buffer layer.

According to an embodiment of the invention, a method of forming the shielding layer includes forming a shielding material layer on the substrate and forming a first mask layer on the substrate. The first mask layer has an opening that exposes the shielding material layer at the second side of the second patterned conductive layer. An anisotropic etching process is performed on the shielding material layer that is exposed by the opening, so as to expose the buffer layer.

According to an embodiment of the invention, a material of the shielding material layer is different from a material of the spacer.

According to an embodiment of the invention, a material of the shielding material layer includes silicon oxide, silicon carbide (SiC), silicon carbonitride (SiCN), silicon carbon oxide (SiCO), silicon carbo-oxynitride (SiCON), or a combination thereof.

According to an embodiment of the invention, a material of the shielding material includes silicon oxide using tetraethyl orthosilicate (TEOS) as a reactive gas.

According to an embodiment of the invention, a material of the buffer material layer includes silicon oxide.

According to an embodiment of the invention, a method of forming the buffer material layer includes performing a thermal oxidization process.

According to an embodiment of the invention, a method of forming the recess on the first sidewall of the first patterned conductive layer includes performing an isotropic etching process.

According to an embodiment of the invention, before forming the drain region, the method further includes removing the tunneling dielectric layer that is not covered by the first patterned conductive layer and exposing a surface of the substrate. The spacer, the second patterned conductive layer, the patterned inter-gate dielectric layer, the first patterned conductive layer, and the tunneling dielectric layer together constitute a first gate stack. A first dielectric layer is formed on the substrate. The first dielectric layer covers the spacer, the second patterned conductive layer, and the source region. A second dielectric layer is formed on the substrate between the drain region and the first gate stack. An erasing gate is formed above the source region, and a selecting gate is formed on the second dielectric layer.

According to an embodiment of the invention, the first gate stack further includes a cap layer that is located on the second conductive layer.

According to an embodiment of the invention, the method further includes forming a second gate stack on the substrate when the first gate stack is formed. The first and second gate stacks together constitute a gate stack set. The method further includes forming another drain region at a side of the second gate stack when the drain region is formed.

Based on the above, the non-volatile memory device described in the embodiments of the invention is equipped with a floating gate that has a warp-around profile and a sharp corner. Thereby, the erasing efficiency and reliability, the erasing performance, and the strength of the read-out current can be improved.

Moreover, in the method of fabricating the non-volatile memory device as described in the embodiments of the invention, by applying a simple and controllable process, the floating gate having the warp-around profile and the sharp corner can be formed, and the profile of the floating gate can remain consistent.

Other features and advantages of the invention will be further understood from the further technological features disclosed by the embodiments of the invention wherein there are shown and described embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

FIG. 1A to FIG. 1G are schematic cross-sectional views illustrating a process flow of fabricating a non-volatile memory according to an embodiment of the invention.

Figure 1A:
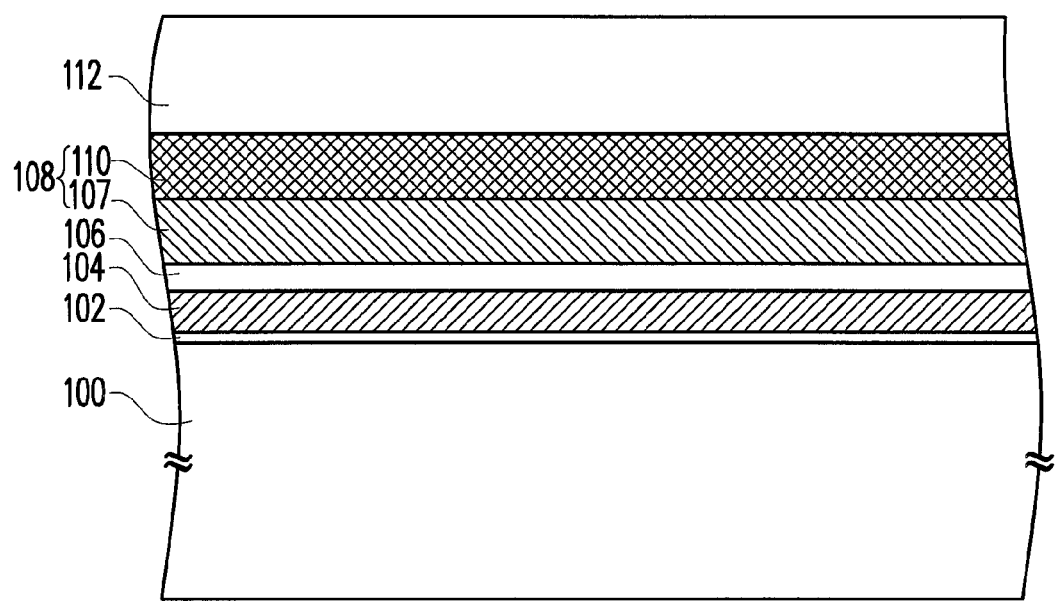
FIG. 1A to FIG. 1G are schematic cross-sectional views illustrating a process flow of fabricating a non-volatile memory according to an embodiment of the invention.

With reference to FIG. 1A, a tunneling dielectric layer 102 is formed on the substrate 100. The substrate 100 can be a semiconductor substrate, e.g., a silicon substrate. Based on actual requirements, a doping process can be performed on the substrate 100, so as to form a well or several wells. This has been disclosed in the related art and thus is not reiterated herein. A material of the tunneling dielectric layer 102 is silicon oxide, for instance, and a method of forming the tunneling dielectric layer 102 is thermal oxidation, for instance. The thickness of the tunneling dielectric layer 102 ranges from about 70 Å to about 130 Å, for instance.

Next, a conductive layer 104 is formed on the tunneling dielectric layer 102, and a material of the conductive layer 104 is doped polysilicon, for instance. A method of forming the conductive layer 104 includes forming an undoped polysilicon layer in a chemical vapor deposition (CVD) process and performing an ion implantation process, for instance. The method of forming the conductive layer 104 can also include forming an undoped polysilicon layer in a CVD process and performing an in-situ doping process. The thickness of the conductive layer 104 ranges from about 150 Å to about 300 Å, for instance.

An inter-gate dielectric layer 106 is formed on the conductive layer 104. The inter-gate dielectric layer 106 can have a stacked structure having a single layer of material or multiple layers of materials. The inter-gate dielectric layer 106 is made of a silicon oxide/silicon nitride/silicon oxide (ONO) stacked layer, for instance. Besides, steps of forming the inter-gate dielectric layer 106 can include, for example, forming a silicon oxide layer by thermal oxidation and forming a silicon nitride layer on the silicon oxide layer by performing a CVD process. A portion of the silicon nitride layer is oxidized by wet $H_2/O_2$, so as to form another silicon oxide layer. The thickness of each layer of the ONO stacked layer respectively ranges from about 30 Å to about 60 Å/from about 40 Å to about 70 Å/from about 30 Å to about 60 Å, for instance. Certainly, the inter-gate dielectric layer 106 can be made of silicon oxide or a silicon oxide/silicon nitride (ON) stacked layer, and the inter-gate dielectric layer 106 can be formed by performing the CVD process with use of different reactive gases based on the material of the inter-gate dielectric layer 106, for instance.

A conductive layer 108 is then formed on the inter-gate dielectric layer 106. The conductive layer 108 can be a stacked layer having a single layer of material or multiple layers of materials. The conductive layer 108 is made of doped polysilicon, a metal silicide layer, metal, or a combination thereof, for instance. In an embodiment of the invention, the conductive layer 108 is made of a doped polysilicon layer. In another embodiment of the invention, the conductive layer 108 is made of a doped polysilicon layer 107 and a metal silicide layer 110. The doped polysilicon layer 107 is formed by forming an undoped polysilicon layer in a CVD process and performing an ion implantation process, for instance. Alternatively, the doped polysilicon layer 107 can be formed by forming an undoped polysilicon layer in a CVD process and performing an in-situ doping process. The thickness of the doped polysilicon layer 107 ranges from about 400 Å to about 600 Å, for instance. The metal silicide layer 110 is made of silicide having refractory metals selected from the group consisting of nickel, cobalt, titanium, copper, molybdenum, tantalum, tungsten, erbium, zirconium, platinum, and an alloy comprising one or more of these metals, for instance. The thickness of the metal silicide layer 110 ranges from about 600 Å to about 1000 Å, for instance. According to another embodiment, a cap layer 112 can be formed on the metal silicide layer 110, so as to prevent the conductive layer 108 from being damaged in subsequent processes (e.g., an etching process). Here, the cap layer 112 can be made of silicon oxide, silicon nitride, or any other appropriate material, for instance. The thickness of the cap layer 112 ranges from about 700 Å to about 1500 Å, for instance.

Figure 1B:
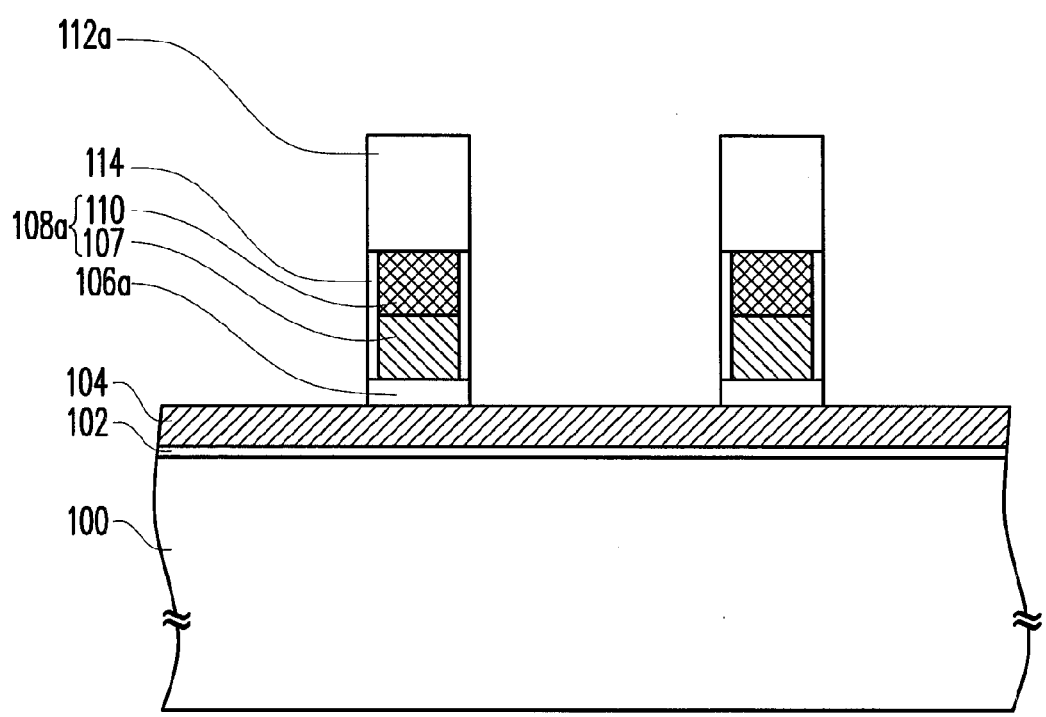

With reference to FIG. 1B, the cap layer 112 and the conductive layer 108 are patterned to form the cap layers 112a and the conductive layers 108a, and the inter-gate dielectric layer 106 is exposed. The method of patterning the cap layer 112 and the conductive layer 108 includes forming a patterned mask layer (not shown) on the substrate 100 and removing a portion of the cap layer 112 and a portion of the conductive layer 108 by etching, for instance. The patterned mask layer is made of photoresist or silicon nitride, for instance. The method of forming the patterned mask layer includes coating a photoresist layer on the substrate 100 and performing exposure and development processes, for instance. The photo mask employed for forming the patterned mask layer is, for instance, a photo mask that defines the control gate (i.e., word lines), such that the patterned conductive layers 108a serve as the control gates (i.e., the word lines). A thermal oxidization process is performed to form liner layers 114 on sidewalls of the conductive layers 108a. Besides, an etching process is performed to entirely remove the inter-gate dielectric layer 106 that is not covered by the cap layer 112. The inter-gate dielectric layer that underlies the cap layer 112 refers to the inter-gate dielectric layers 106a, and the conductive layer 104 is exposed. The thermal oxidization process and the process of removing the inter-gate dielectric layer 106 can be performed in an appropriate order based on actual requirements. According to an embodiment of the invention, the thermal oxidization process can be performed, and then the process of removing the inter-gate dielectric layer 106 can be carried out. According to another embodiment of the invention, the process of removing the inter-gate dielectric layer 106 can be performed, and then the thermal oxidization process can be carried out. The thermal oxidization process is, for instance, a rapid thermal annealing (RTA) process or a rapid thermal oxidation (RTO) process. The process of removing the inter-gate dielectric layer 106 can be an anisotropic etching process (e.g., a dry etching process) or an isotropic etching process (e.g., a wet etching process).

Figure 1C:
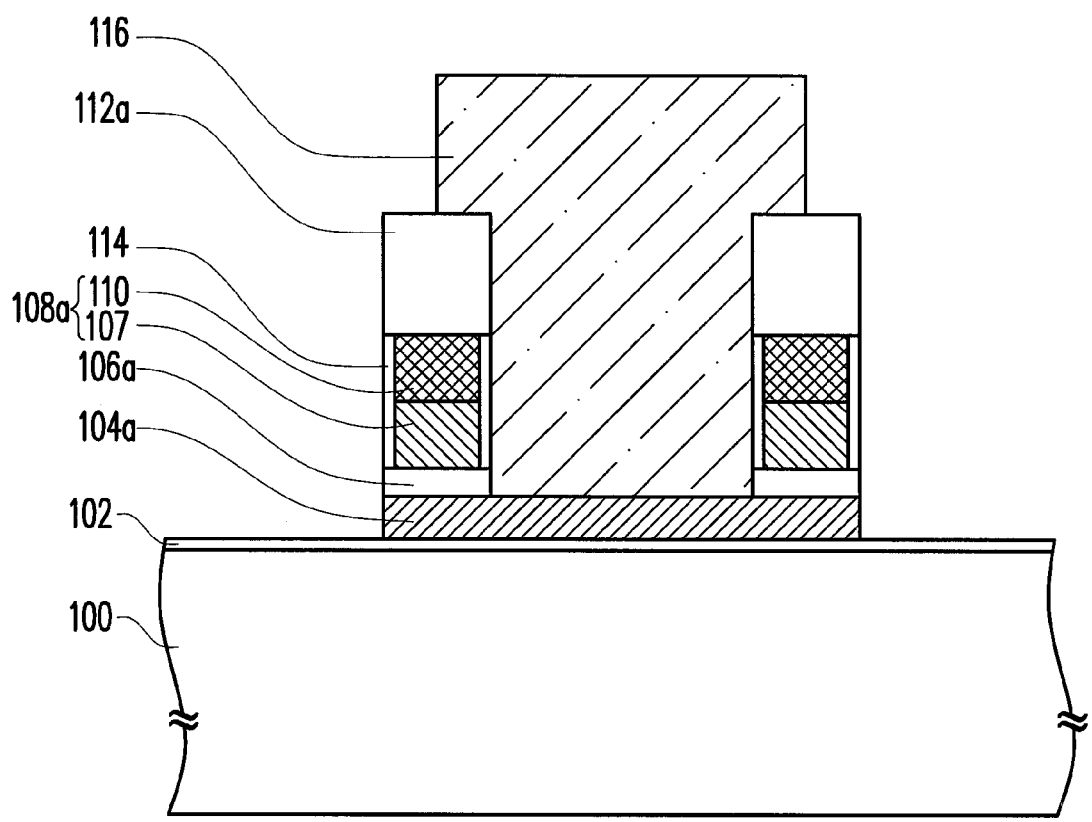

With reference to FIG. 1C, a portion of the conductive layer 104 located at one side of each cap layer 112a (i.e., the outer sides of the two cap layers 112a shown in the drawings) is removed to expose a surface of the tunneling dielectric layer 102, and the remaining conductive layer is the conductive layer 104a. The method of removing the conductive layer 104 at a side of the conductive layer 108 includes forming a patterned mask layer 116 to cover a portion of the cap layers 112a and the conductive layer 104a located between the cap layers 112a, for instance. The patterned mask layer 116 is a patterned photoresist layer formed by performing the exposure process, the development process, and so on, for instance. With use of the patterned mask layer 116 as a mask, the conductive layer 104 that is not covered is etched. The method of etching the conductive layer 104 can be anisotropic etching (e.g., dry etching).

Figure 1D:
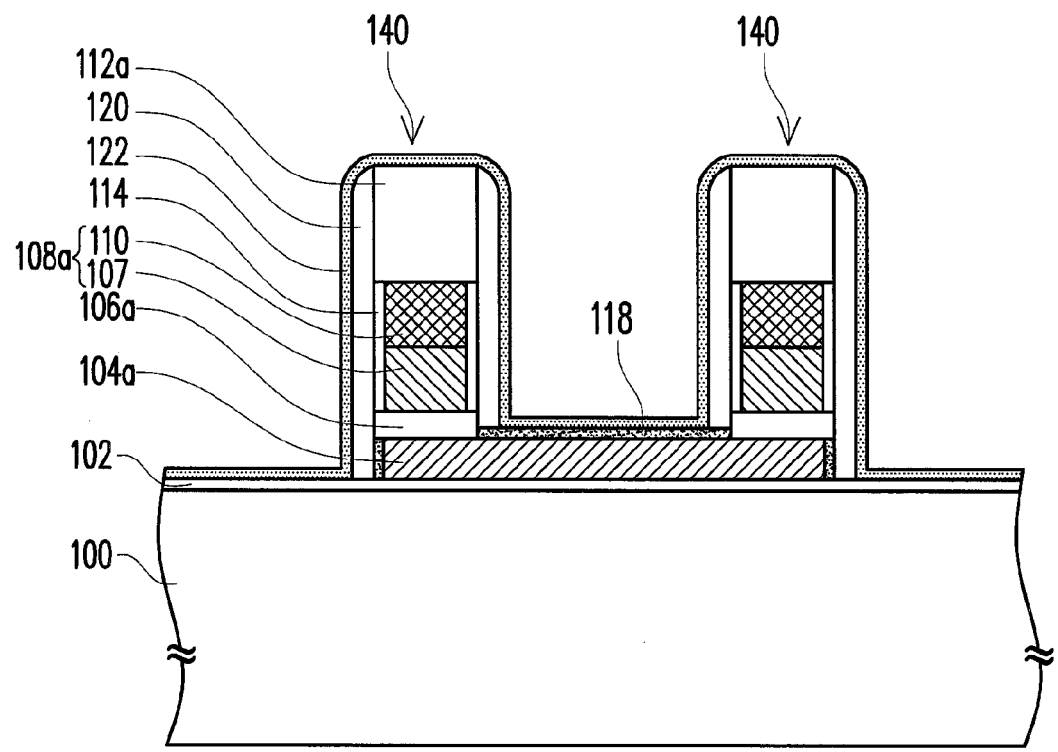

As indicated in FIG. 1D, the patterned mask layer 116 is removed. A buffer material layer 118 is formed on a surface of the conductive layer 104a located between the conductive layers 108a. A material of the buffer material layer 118 is silicon oxide, for instance. The thickness of the buffer material layer 118 ranges from about 70 Å to about 110 Å, for instance. The buffer material layer 118 is formed by performing the thermal oxidization process, for instance, such that the exposed surface of the conductive layer 104a between the two cap layers 112a is oxidized. The thermal oxidization process is a RTO process, for instance.

Spacers 120 are formed on the sidewalls of the cap layers 112a, the sidewalls of the conductive layers 108a, and the sidewalls of the inter-gate dielectric layers 106a. The spacers 120 are made of silicon nitride, silicon oxide, a combination thereof, or any other appropriate dielectric material, for instance. Besides, the spacers 120 are formed by forming a conformal spacer material layer (not shown) above the substrate 100 in a CVD process, and the thickness of the conformal spacer material layer (not shown) ranges from about 100 Å to about 200 Å, for instance. A portion of the conformal spacer material layer is then removed to form the spacers. The method of removing the portion of the conformal spacer material layer to form the spacers 120 includes performing a blanket etching process, for instance. The blanket etching process herein is an anisotropic etching process (e.g., a dry etching process), for instance.

A shielding material layer 122 is formed to cover the tunneling dielectric layer 102, the spacers 120, the cap layers 112a, and the buffer material layer 118. The shielding material layer 122 and the spacers 120 are made of different materials. Here, the shielding material layer 122 is made of silicon oxide, silicon carbide (SiC), silicon carbonitride (SiCN), silicon carbon oxide (SiCO), silicon carbo-oxynitride (SiCON), or a combination thereof, for instance. Beside, the shielding material layer 122 is formed by performing a CVD process, for instance. The thickness of the shielding material layer 122 ranges from about 100 Å to about 500 Å, for instance. In an embodiment of the invention, the shielding material layer 122 is made of silicon oxide and is formed by performing the CVD process with use of tetraethyl orthosilicate (TEOS) as a reactive gas, for instance. The resultant silicon oxide is referred to as TEOS silicon oxide. In another embodiment of the invention, the shielding material layer 122 is made of silicon oxide and is formed by performing a high-temperature thermal oxidization process, for instance.

Figure 1E:
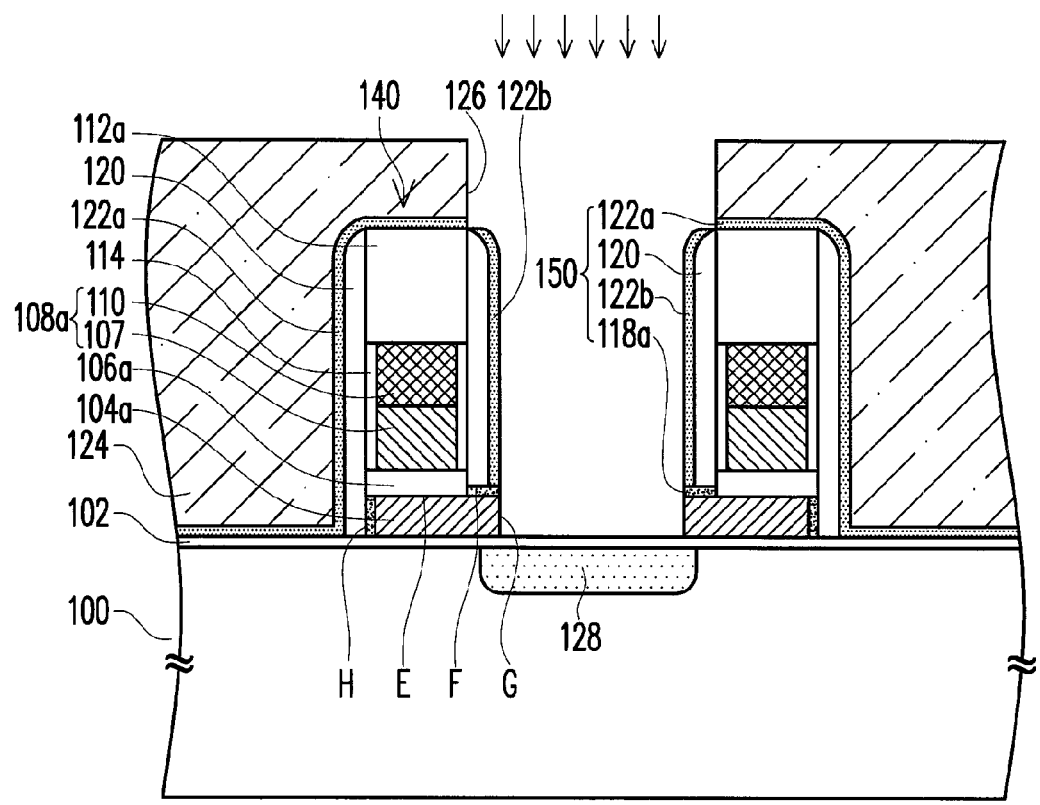

With reference to FIG. 1E, a patterned mask layer 124 is formed on the substrate 100. The patterned mask layer 124 has an opening 126 that at least exposes the shielding material layer 122 located between the two cap layers 112a. The thickness of the patterned mask layer 124 ranges from about 4000 Å to about 5000 Å, for instance. The patterned mask layer 124 is a patterned photoresist layer formed by performing the exposure process, the development process, and so on, for instance.

An anisotropic etching process is performed on the shielding material layer 122 exposed by the opening 126. After the anisotropic etching process is performed, the shielding material layer 122 is divided into shielding layers 122a and 122b. The profile of the shielding layers 122b is similar to the profile of the spacers 120, and the buffer material layer 118 (not shown) is exposed. The buffer material layer 118 that is not covered by the shielding layers 122b and the conductive layers 104a that underlie the buffer material layer 118 are removed to expose the surface of the tunneling dielectric layer 106a. Here, the remaining buffer material layer refers to the buffer layers 118a. The anisotropic etching process and the process of removing the buffer material layer 118 and the underlying conductive layer 104a can be a dry etching process, for instance. So far, as shown in FIG. 1E, the inter-gate dielectric layers 106a, the conductive layers 108a, and the cap layers 112a are stacked on first surfaces E of the conductive layers 104a. The second surfaces F of the conductive layers 104a are covered by the buffer layers 118a, the spacers 120, and the shielding layers 122b. The spacers 120 above the buffer layers 118a extend from the sidewalls of the cap layers 112a to cover the sidewalls of each layer between the cap layers 112a and the inter-gate dielectric layers 106a, while the sidewalls G of the conductive layers 104a are exposed. The shielding layers 122b on the buffer layers 118a cover the outer sides of the spacers 120. The spacers 120 and the shielding layers 122a not only extend from the sidewalls of the cap layers 112a to cover the sidewall of each layer between the cap layers 112a to the inter-gate dielectric layer 106a but also cover the sidewalls H of the conductive layers 104a. From another perspective, the shielding layer 122a, the shielding layer 122b, the spacer 120, and the buffer layer 118a can be considered as a passivation layer 150 that covers each layer on the substrate 100 but exposes the sidewall G of the conductive layer 104a.

An ion implantation process is performed with use of the mask layer 124 as a mask. Thereby, dopant can be implanted into the substrate 100 below the opening 126 to form the source region 128.

Figure 1F:
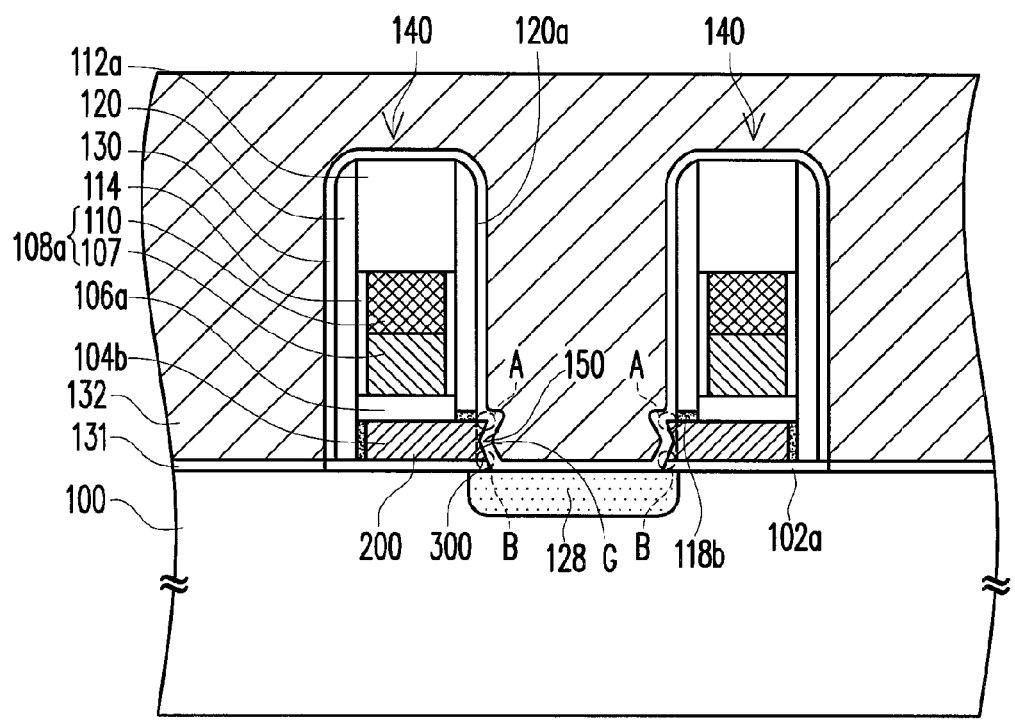

With reference to FIG. 1F, the patterned mask layer 124 is removed. A portion of the conductive layers 104a which is not covered by the passivation layers 150 (i.e., the sidewalls G of the conductive layers 104a) is removed with use of the passivation layer 150 (especially the shielding layers 122a and 122b) shown in FIG. 1E as a mask. Thereby, the remaining sidewalls G of the conductive layers 104b have recesses G. Namely, the conductive layers 104b have upper sharp corners (acute angles) A and lower sharp corners B. That is, the conductive layers 104b have warp-around profiles. The portion of the conductive layers 104a below the shielding layers 122a is removed by performing an isotropic etching process, for instance. Specifically, hydrogen bromide and chlorine gas serve as the etching gas to perform a dry etching process for removing the portion of the conductive layers 104a below the shielding layers 122a, for instance.

The outer shielding layers 122a and the underlying tunneling dielectric layer 102a are removed to expose the surface of the substrate 100, and the inner shielding layers 122b and the underlying buffer layers 118a are removed to expose the upper sharp corners A of the conductive layers 104b. However, the buffer layers 118b below the spacers 120 are left. The conductive layers 104b serving as the floating gates and located below the inter-gate dielectric layers 106a and the spacers 120 extend from the inter-gate dielectric layers 106a to the spacers 120 between the conductive layers 108a. Besides, the upper sharp corners (the acute angles) A and the lower sharp corners B of the conductive layers 104b protrude from vertical surfaces 120a of the inner spacers 120. Namely, each conductive layer 104b is constituted by a first portion 200 and a second portion 300. In each conductive layer 104b, the first portion 200 is where the conductive layer 104b is in contact with the inter-gate dielectric layer 106a. The second portion 300 is a bulging ring-like portion that surrounds the first portion 200 and has the upper sharp corner (the acute angle) A and the lower corner B. This bulging ring-like portion protrudes from the vertical surface 120a of the spacer 120.

The dielectric layers 130 are formed on the substrate 200 to conformally cover the spacers 120, the cap layers 112a, and the conductive layers 104b. The dielectric layers 130 are high-temperature oxide (HTO) layers, for instance. The thickness of each dielectric layer 130 ranges from about 70 Å to about 130 Å, and the dielectric layer 130 located above the source region 128 is relatively thick. The dielectric layers 130 are formed by forming dielectric material layers (not shown) to cover the tunneling dielectric layers 102a, the spacers 120a, the cap layers 112a, and the conductive layers 104b. Patterned mask layers (not shown) are formed to cover the dielectric material layers above the spacers 120 and the cap layers 112a and fill the gap between the conductive layers 108a. A portion of the dielectric material layers is removed with use of the patterned mask layers, so as to form the dielectric layers 130.

Dielectric layers 131 are formed on the substrate 200 outside of the dielectric layers 130. The dielectric layers 131 are low voltage (LV) oxide layers, for instance, and the thickness of each dielectric layer 131 ranges from about 60 Å to about 70 Å, for instance. A conductive layer 132 is formed on the substrate 100 to cover the dielectric layers 130 and 131. The conductive layer 132 is made of doped polysilicon, for instance, and the method of forming the conductive layer 130 includes forming an undoped polysilicon layer in a CVD process and then performing an ion implantation process, for instance. The method of forming the conductive layer 130 can also include forming an undoped polysilicon layer in a CVD process and simultaneously performing an in-situ doping process. The thickness of the conductive layer 132 ranges from about 2000 Å to about 3000 Å, for instance.

Figure 1G:
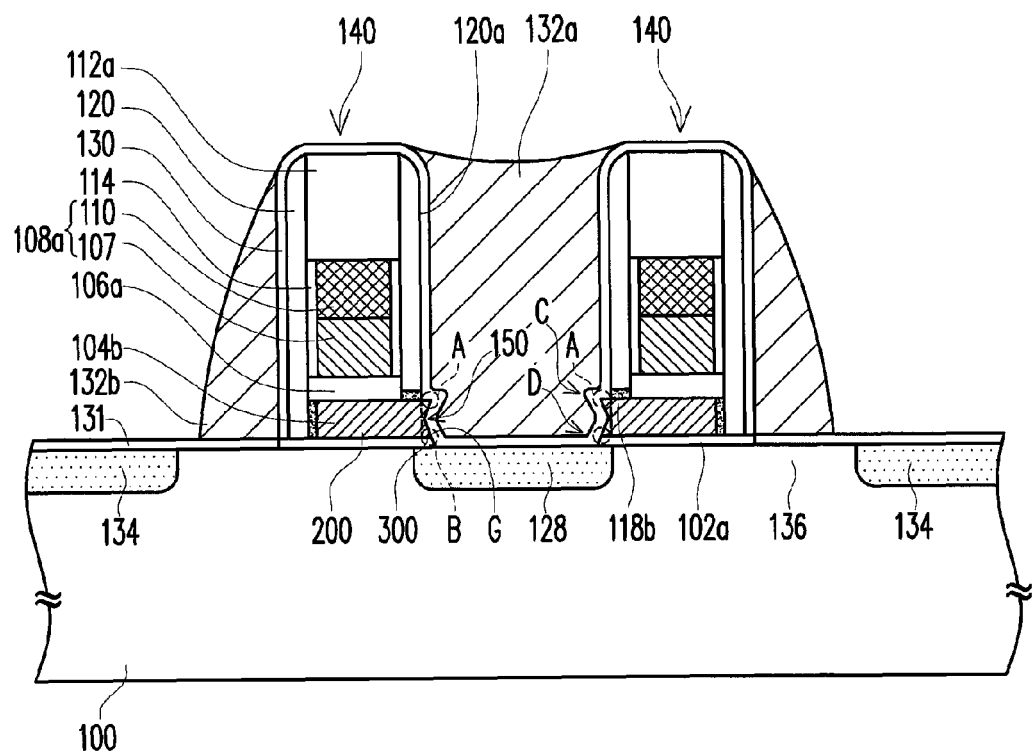

With reference to FIG. 1G, a portion of the conductive layer 132 is removed, so as to form an erasing gate 132a above the source region 128 and form selecting gates 132b on the sidewalls of the spacers 120. The portion of the conductive layer 132 is removed by performing a blanket etching process, for instance. The erasing gate 132a has recesses C and D respectively corresponding to the sharp corners A and B of the conductive layers 104b (the floating gates). The dielectric layer 130 between the erasing gate 132a and the source region 128 acts as the erasing gate dielectric layer; the dielectric layer 130 between the erasing gate 132a and the conductive layers (the floating gates) 104b acts as the tunneling dielectric layer; the dielectric layers 131 between the selecting gates 132b and the substrate 100 act as the selecting gate dielectric layers. Drain regions 134 are formed in the substrate 100 at outer sides of the selecting gates 132a, and the drain regions 134 are not in contact with the selecting gates 132a. The drain regions 134 are formed by performing an ion implantation process, for instance. The dopant in the drain regions 134 and the dopant in the source region 128 have the same conductive type (e.g., n-type dopant or p-type dopant). A channel region 136 is located between the source region 128 and the drain region 134.

The subsequent process of fabricating the non-volatile memory is well-known to people skilled in the art and is not described herein.

As indicated in FIG. 1G, the non-volatile memory described in the embodiments of the invention includes the substrate 100, the gate stacks 140, the source region 128, the drain regions 134, the dielectric layers 130 and 131, the erasing gate 132a, and the selecting gates 132b.

According to an embodiment of the invention, two adjacent gate stacks 140 constitute a gate stack set. The erasing gate 132a is located between the two adjacent gate stacks 140. The selecting gates 132b are located at outer sides of the two adjacent gate stacks 140. The source region 128 is configured in the substrate 100 below the erasing gate 132a that is between the two gate stacks 140. The drain regions 134 are configured in the substrate 100 at the outer sides of the selecting gates 132b, and the drain regions 134 are not connected to the selecting gates 132b. The dielectric layers 130 are configured on surfaces of the gate stacks 140 and on the source region 128. In particular, the dielectric layers 130 separate the gate stacks 140 from the selecting gates 132, separate the gate stacks 140 from the erasing gate 132a, and separate the erasing gate 132a from the source region 128. The dielectric layers 131 are configured above the substrate 100 at the outer sides of the selecting gates 132b and separate the substrate 100 from the selecting gates 132b.

The gate stacks 140 are configured on the substrate 100. In an embodiment, each gate stack 140 is constituted by the tunneling dielectric layer 102a, the conductive layer (the floating gate) 104b, the inter-gate dielectric layer 106a, the conductive layer (the control gate) 108a, and the spacers (i.e., the inner spacer and the outer spacer) 120. The tunneling dielectric layer 102a is configured on the substrate 100. The conductive layer (the floating gate) 104b is configured on the tunneling dielectric layer 102a. The sidewall of the conductive layer (the floating gate) 104b has a recess 150 that includes the sharp corner (an acute angle) A and the sharp corner B. That is, the conductive layer (the floating gate) 104b has a warp-around profile. The inter-gate dielectric layer 106a is configured between the conductive layer (the floating gate) 104b and the control gate 108a. The conductive layer (the control gate) 108a is configured on the inter-gate dielectric layer 106a. The outer spacer 120 adjacent to the drain region 134 is configured on the sidewall of the conductive layer (the control gate) 108a, the sidewall of the inter-gate dielectric layer 106a, and the sidewall of the conductive layer (the floating gate) 104b. The inner spacer 120 adjacent to the source region 128 is configured on the sidewall of the conductive layer (the control gate) 108a and the sidewall of the inter-gate dielectric layer 106a. The inner spacer 120 is separated from the underlying conductive layer 104b by the buffer layer 118b. The upper sharp corner (the acute angle) A and the lower sharp corner B of the conductive layer (the floating gate) 104b protrude from the vertical surface 120a of the inner spacer 120. The erasing gate 132a has recesses C and D respectively corresponding to the sharp corners A and B of the conductive layers 104b (the floating gates).

According to another embodiment of the invention, the gate stack 140 not only includes the tunneling dielectric layer 102a, the conductive layer (the floating gate) 104b, the inter-gate dielectric layer 106a, the conductive layer (the control gate) 108a, and the spacers 120 but also includes the cap layer 112a above the conductive layer 108a. In addition, according to still another embodiment of the invention, liner layers 114 can be located between the spacers 120 and the conductive layer 108a.

In light of the foregoing, according to the method of fabricating the non-volatile memory, the floating gate having a warp-around profile and a sharp corner can be formed by performing a simple and controllable process. The profile of each floating gate is rather consistent. Besides, the strength of the electric field at the sharp corner of the floating gate is significant, and thereby the erasing efficiency and reliability, the erasing performance, and the strength of the read-out current can be improved.

Although the invention has been described with reference to the above embodiments, it will be apparent to one of the ordinary skill in the art that modifications to the described embodiments may be made without departing from the spirit of the invention. Accordingly, the scope of the invention will be defined by the attached claims rather than by the above detailed descriptions.

What is claimed is:

1. A non-volatile memory comprising:
a substrate;
a first gate stack located on the substrate;
a selecting gate located on the substrate at a first side of the first gate stack;
an erasing gate located on the substrate at a second side of the first gate stack;
a source region located in the substrate under the erasing gate;
a drain region located in the substrate at a side of the selecting gate;
a first dielectric layer located between the first gate stack and the erasing gate and between the first gate stack and the source region; and
a second dielectric layer located between the selecting gate and the substrate,
the first gate stack comprising:

a tunneling dielectric layer, a floating gate, an inter-gate dielectric layer, and a control gate sequentially stacked from bottom to top; and a spacer located on a sidewall of the control gate and a sidewall of the inter-gate dielectric layer, wherein a side of the floating gate adjacent to the erasing gate has a warp-around profile and has a sharp corner, and the sharp corner protrudes beyond a vertical surface of the spacer.

2. The non-volatile memory as recited in claim 1, wherein the erasing gate has a recess profile corresponding to the sharp corner of the floating gate.

3. The non-volatile memory as recited in claim 1, wherein the first dielectric layer conformably covers a surface of the first gate stack and a surface of the source region.

4. The non-volatile memory as recited in claim 1, further comprising a buffer layer located between the spacer and the floating gate.

5. The non-volatile memory as recited in claim 1, wherein the first gate stack further comprises a cap layer located on the control gate.

6. The non-volatile memory as recited in claim 1, further comprising:

a second gate stack, a structure of the second gate stack and a structure of the first gate stack being the same, the second and first gate stacks constituting a gate stack set; and another drain region located in the substrate at a side of the second gate stack.

* * * * *